(12) United States Patent
Waltman

(10) Patent No.: US 6,356,143 B2
(45) Date of Patent: *Mar. 12, 2002

(54) METHOD AND APPARATUS FOR FILTERING RADIO FREQUENCY SIGNALS

(75) Inventor: Steven B. Waltman, Boulder, CO (US)

(73) Assignee: Intreon Corporation, Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/430,922

(22) Filed: Nov. 1, 1999

(51) Int. Cl.[7] .................................................. H03B 1/00

(52) U.S. Cl. .................. 327/557; 327/554; 327/592; 333/166; 333/173; 333/205; 333/217; 331/77; 330/303; 330/306

(58) Field of Search .............................. 327/551–559, 327/592, 896; 333/213–217, 166, 167, 173, 175, 202–207; 330/254, 305, 306, 303; 331/77, 57, 108 B

(56) References Cited

U.S. PATENT DOCUMENTS

| 5,180,996 A | * | 1/1993 | Shiga ........................... 331/77 |
| 5,371,475 A | * | 12/1994 | Brown ........................ 330/254 |
| 5,550,520 A | * | 8/1996 | Kabayashi ................... 333/213 |
| 5,977,835 A | * | 11/1999 | Huang ......................... 330/305 |

* cited by examiner

Primary Examiner—Timothy P. Callahan
Assistant Examiner—Minh Nguyen
(74) Attorney, Agent, or Firm—Blakely, Sokoloff, Taylor & Zafman LLP

(57) ABSTRACT

A variable bandpass filter system passes a selected range of frequencies while rejecting other frequencies in an RF input signal. The system includes a switch and an oscillator. The switch receives the RF input signal and an oscillating calibration signal, and passes the RF input signal or said oscillating calibration signal based on a control signal. The oscillator receives an output of the switch, and frequency and gain control signals. The frequency control signal selects an operating frequency of the oscillator, such that the operating frequency determines a range of frequencies to pass. The gain control signal selects gain of the oscillator, where the oscillating calibration signal allows the oscillator to be calibrated by varying the gain such that the oscillator acts as a filter.

11 Claims, 11 Drawing Sheets

METHOD AND APPARATUS FOR FILTERING RADIO FREQUENCY SIGNALS

FIELD OF THE INVENTION

The present invention relates to the field of radio frequency electronics. In particular the present invention discloses an active filter for filtering signals over a relatively large bandwidth range.

BACKGROUND OF THE INVENTION

Computer and digital communication networks have traditionally been constructed using wired network technologies. However, the expense and difficulty of installing a wired network has sped the growth of a wireless digital communication industry. Cellular telephone networks, satellite communication networks, and wireless computer networks all now use digital wireless communication technologies.

The military and large corporations have used digital wireless communication systems for many years now. However, the consumer market for digital wireless communications is still relatively young. To penetrate the consumer market, digital wireless communication systems must be simple, reliable, and most importantly inexpensive. Therefore, it would be desirable to improve the designs of wireless communication circuitry such that the wireless communication circuitry can be used in the consumer market.

SUMMARY OF THE INVENTION

A variable frequency active filter circuit for tuning in a specific bandpass frequency is disclosed. The active filter incorporates a controlled oscillator circuit for tuning into a specific frequency range. A frequency input signal controls the active filter bandpass frequency by tuning the oscillator circuit to a desired frequency. The controlled oscillator circuit further includes a gain input. The gain input is set to a value just below where the oscillator circuit would oscillate.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which.

DETAILED DESCRIPTION OF THE PREFERRED EMBODIMENT

A method and apparatus for implementing an active filter circuit for receiving radio frequency signals across a wide frequency range is disclosed. In the following description, for purposes of explanation, specific nomenclature is set forth to provide a thorough understanding of the present invention. However, it will be apparent to one skilled in the art that these specific details are not required in order to practice the present invention. For example, the present invention has been described with reference to filtering digital satellite signals. However, the same techniques can easily be applied to other types of radio frequency signals.

Satellite Communications

Figure 1:
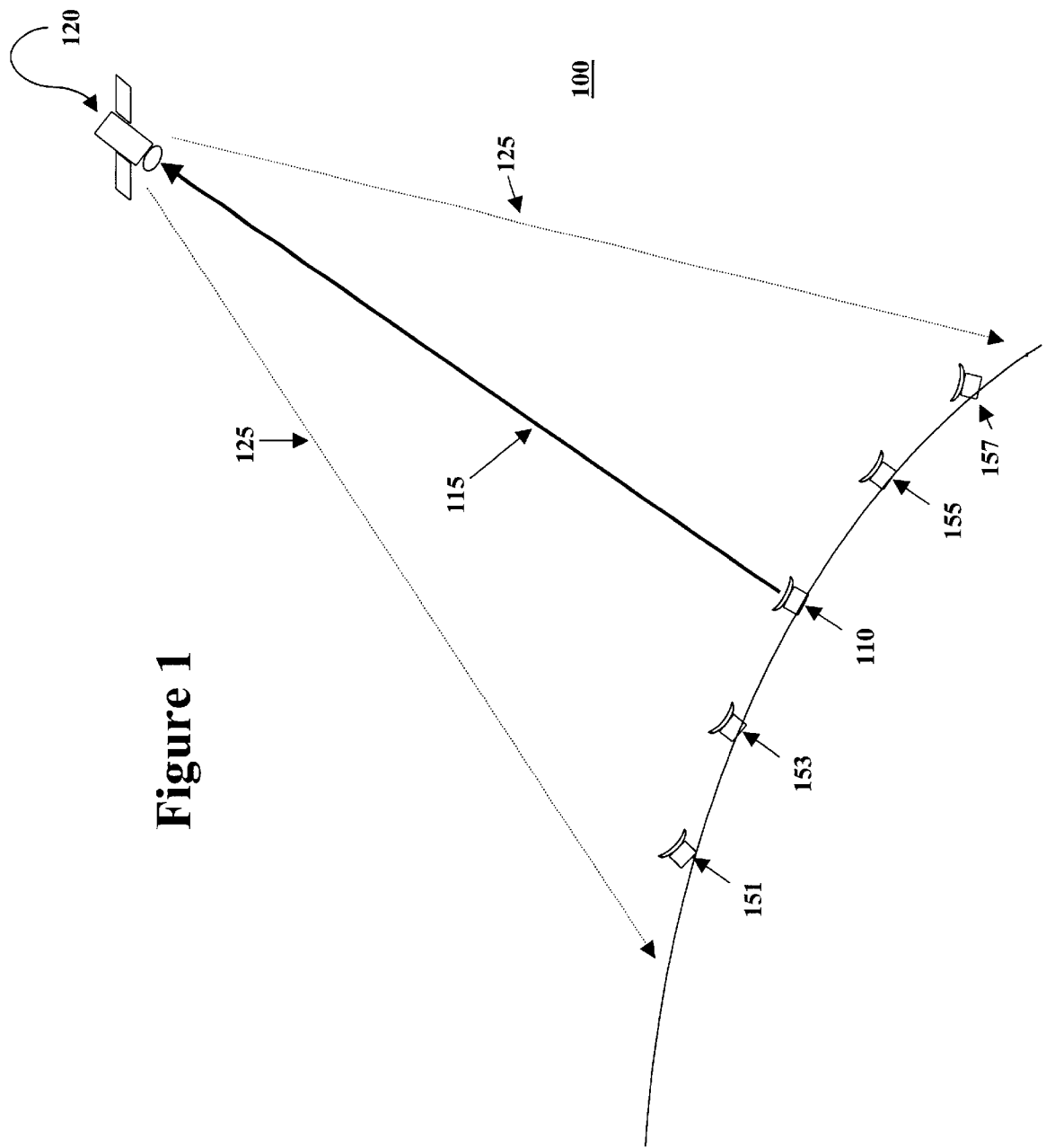
FIG. 1 illustrates a satellite data distribution system with an uplink transmitter, a communications satellite, and a number of receiver systems.

FIG. 1 illustrates a conceptual diagram of a typical satellite communication system 100. In the typical satellite communication system 100 of FIG. 1, an uplink earth station 110 modulates and transmits an uplink signal 115 to a communication satellite 120. The communication satellite 120 transmits the received signal back down to a plurality of receivers 151, 153, 155, and 157 with a downlink signal 125. In a Ku-band satellite system, the downlink signal 125 is in the frequency range of 10.7 to 15.0 GHz. The receivers 151, 153, 155, and 157 demodulate the downlink signal 125 to extract the encoded information.

Figure 2:
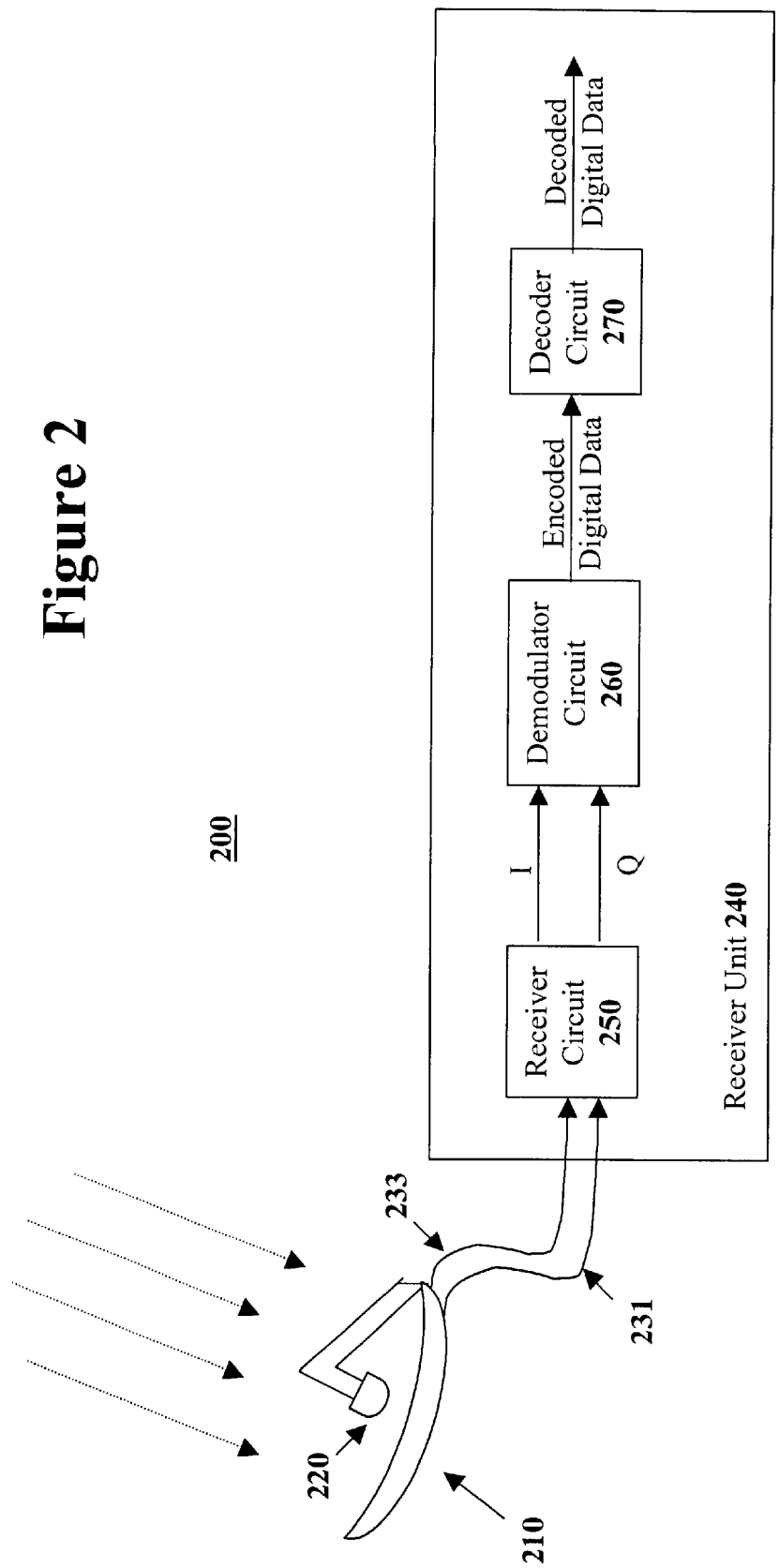
FIG. 2 illustrates a block diagram of a typical satellite receiver system that receives, demodulates, and decodes digital satellite signals.

FIG. 2 illustrates a block diagram of a typical satellite receiver system 200. In the satellite receiver system 200 of FIG. 2, a dish antenna 210 receives a downlink signal transmitted by a communications satellite. The dish antenna usually includes a low-noise block down converter (LNB) 220 that translates the high frequency satellite carrier signal to a lower intermediate frequency (IF) that will be used for signal processing. In a typical consumer satellite receiver system, the downlink signal is down-converted to an L-band signal in the range of 950 to 2150 MHz. The down-conversion allows the signal to be carried on coaxial cables 231 and 233 to a receiver unit 240. Instead of using two coaxial cables 231 and 233, a single coaxial cable may be used with DC voltage used to switch between polarizations.

A receiver circuit 250 in the receiver unit 250 amplifies the signal and tunes into a specific frequency using bandpass filters and a tuner circuit. The receiver circuit 250 outputs an In-phase (I) data signal and a Quadrature (Q) data signal. The I and Q data signals are demodulated by a demodulator circuit 260. Many satellite communication systems, such as direct broadcast satellite television systems, use Quadrature phase shift keying (QPSK) modulation. Quadrature phase shift keying (QPSK) is used in satellite communication because of its power efficiency and its robustness against phase noise. The demodulator circuit 260 outputs an encoded data stream. The encoded data stream usually comprises a forward error correction encoded (FEC) data stream. A decoder circuit 270 decodes the encoded data stream to generate a decoded data stream.

Figure 3:
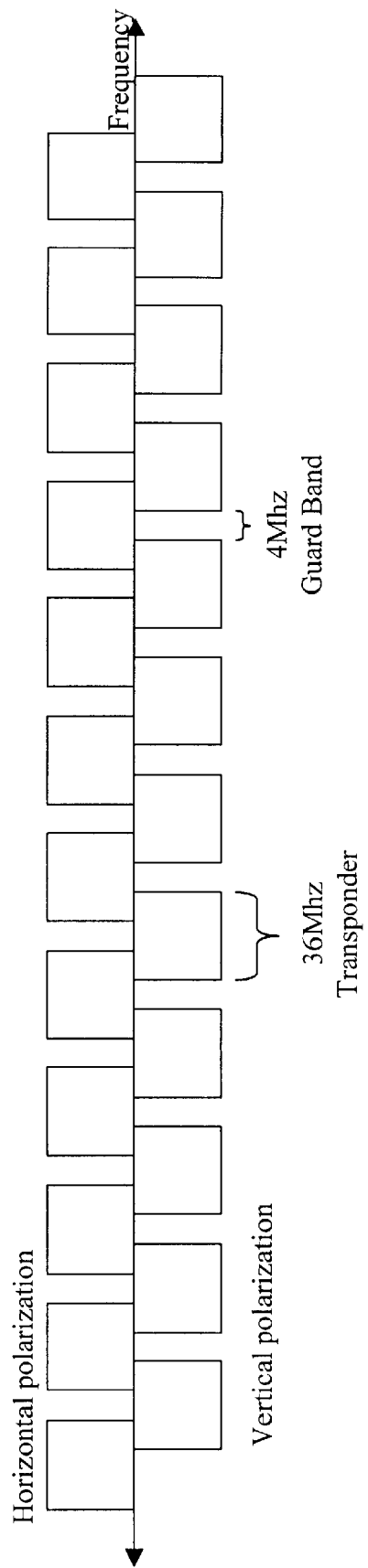
FIG. 3 illustrates a bandwidth diagram of twenty-four transponders with a bandwidth of thirty-six megahertz each on a communication satellite where half of the transponders in the horizontal polarization and half of the transponders in the vertical polarization.

Communication satellites carry a number of different transponder units that receive and retransmit a number of different frequency ranges. Many communication satellites contain twenty-four (24) different transponders that each broadcast 36 Mhz wide frequency "channels". FIG. 3 illustrates a diagram that graphically illustrates the frequency channels in a twenty-four transponder satellite embodiment. As illustrated in FIG. 3, a first set of twelve channels use horizontal polarization and a second set of channels use a vertical polarization. In the diagram of FIG. 3, each channel is 36 Mhz wide. To prevent interference between the transponders, the channels using the same polarity are separated with a four MHz guard band. Note that many different satellite transponder embodiments exist.

Figure 4:
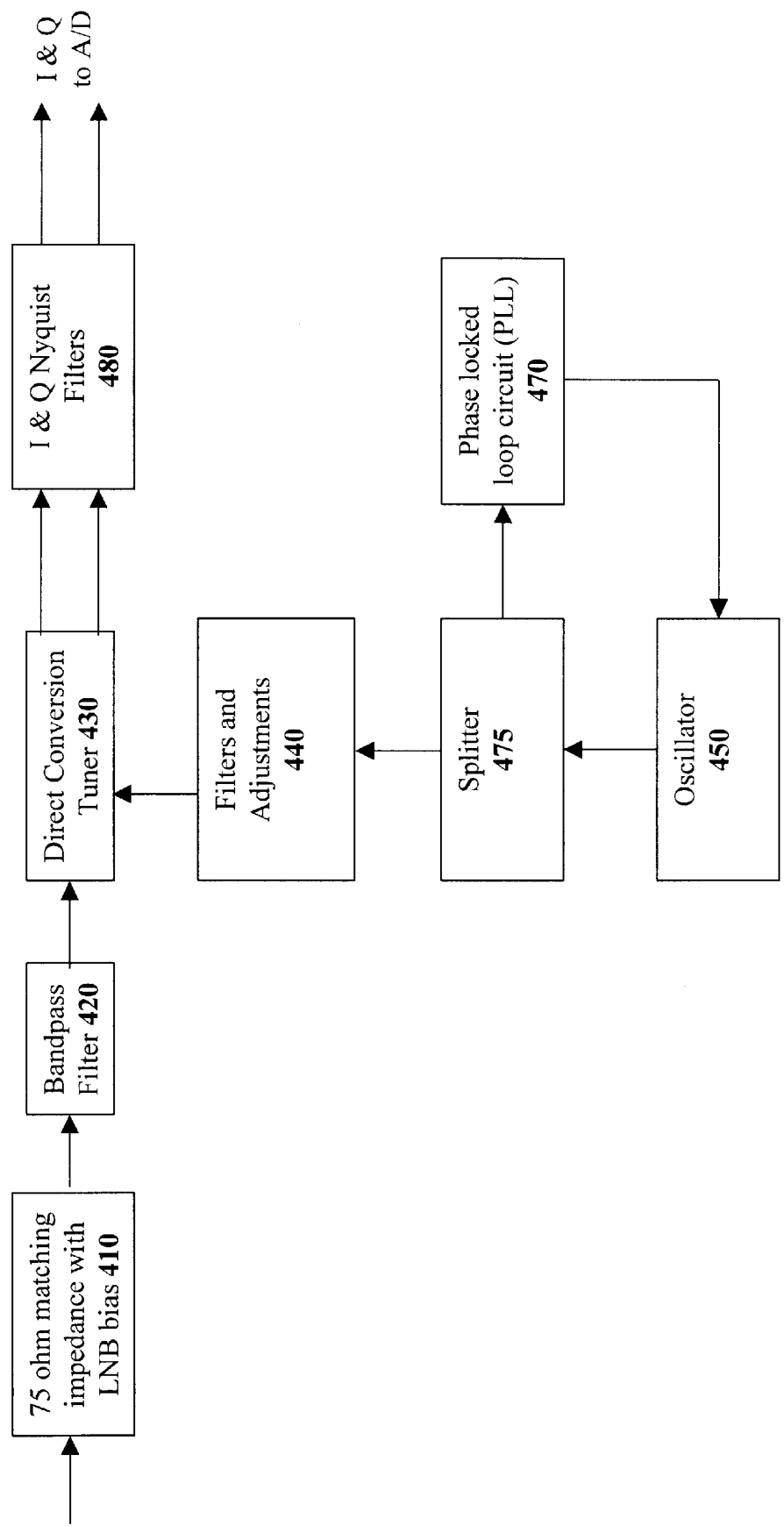
FIG. 4 illustrates a block diagram of a receiver circuit that uses a bandpass filter.

To tune into a specific frequency channel, most RF receiver systems (such as satellite receiver systems) use a fixed bandpass filter that eliminates signals outside of the desired frequency range. For example, FIG. 4 illustrates a block diagram of the receiver system that uses a fixed bandpass filter 420 to tune into a specific transponder frequency. By eliminating the signals outside of the desired frequency range, the receiver will be able to better demodulate the desired signal. In receiver systems with a fixed bandpass filter, the receiver may only access a few transponders within the limited bandpass frequency range of the bandpass filter.

A Tunable Bandpass Filter

Figure 5:
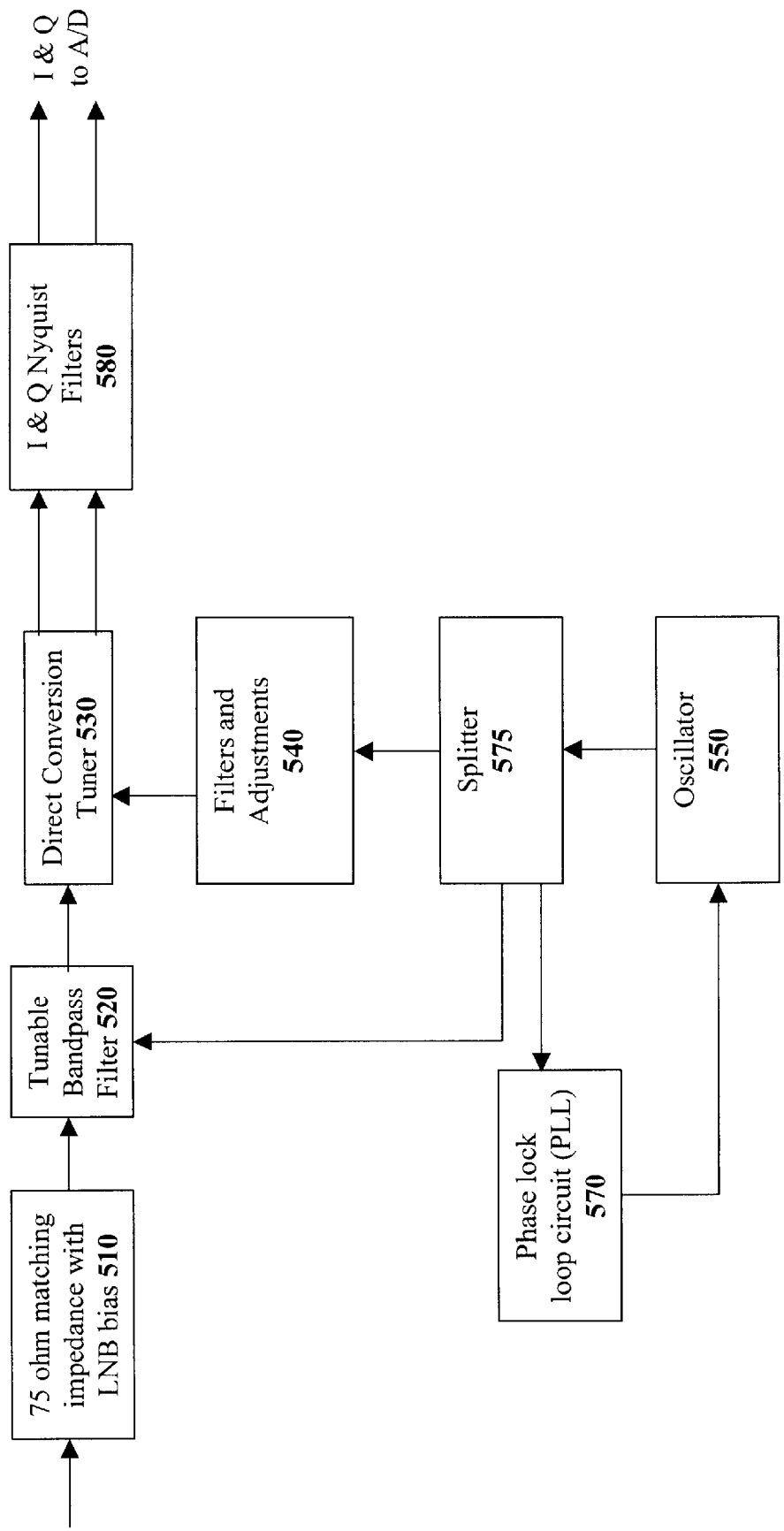
FIG. 5 illustrates a block diagram of a receiver circuit that uses a variable active filter circuit.

To be able to tune into all the transponders on a satellite with sufficient signal quality at any transponder frequency range, the present invention introduces a variable bandpass filter that allows the tuner to tune into any transponder. FIG. 5 illustrates a block diagram of a receiver with the variable bandpass filter 520. In the tuner circuit of FIG. 5, the variable bandpass filter 520 provides a high quality input signal for any of the transponders on a communications satellite since the variable bandpass filter 520 filters out signals from the transponders not be tuned.

Figure 6:
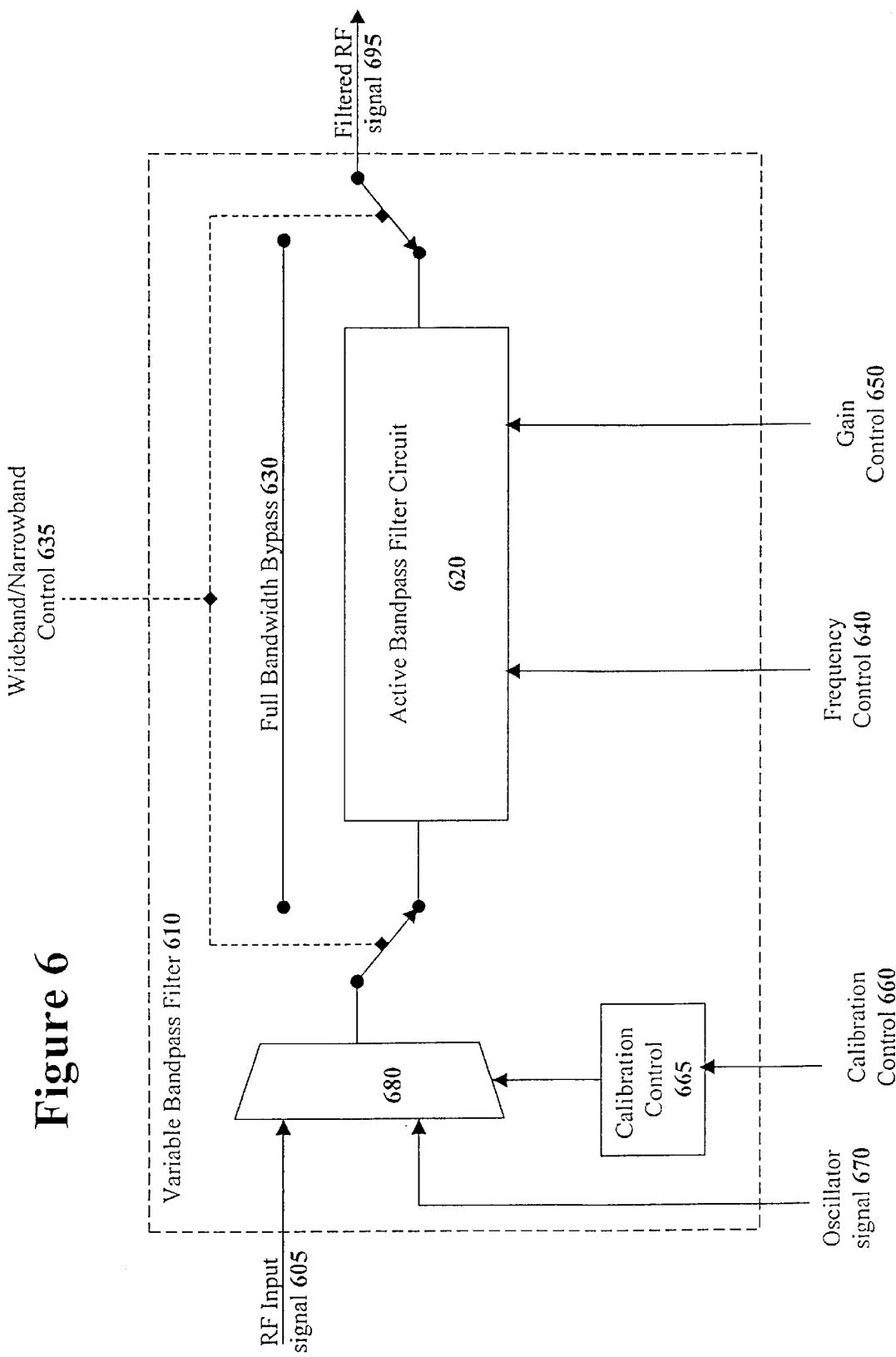
FIG. 6 illustrates a block diagram of one embodiment of a variable active filter circuit.

FIG. 6 illustrates a block diagram of one embodiment of a variable bandpass tuner 610. The variable bandpass tuner 610 receives the radio frequency input signal 605 from the satellite antenna and outputs a filtered radio frequency signal 695. The main feature of bandpass filter 610 is the active filter circuit 620. The active filter circuit 620 is used to filter out signals that are not within a specified pass band and provide some gain for signals within the pass band. If the entire satellite transponder spectrum is to be examined, the active filter circuit 620 may be by passed using the full bandwidth bypass 630 under the control of a wideband/narrowband control signal 635.

The active filter circuit 620 is controlled with two input signals. The first input signal is a frequency control input signal 640. The frequency control input signal 640 is used to select the desired transponder frequency.

The second control signal of the active filter circuit 620 is a gain control input signal 650. The gain control input signal 650 determines a gain setting for the active filter circuit 620. Due to the new active filter design of active filter circuit 620, the new active filter design of the active filter circuit 620 must be calibrated to set the gain value of the gain control input signal 650.

To calibrate the active filter circuit 620 to set the gain value, a calibration control signal 660 is activated in order to have multiplexor 680 direct an oscillator signal 670 into the active filter circuit 620. Referring back to FIG. 5, the oscillator signal 670 is from the oscillator 550 used by the tuner circuit 530. While the oscillator signal 670 passes through the active filter circuit 620, a calibration system adjusts the gain control input 650 to a proper setting as set forth in the following section.

New Active Filter Design

The present invention introduces a new type of variable active filter circuit design. In the new active filter design of the present invention, an oscillator circuit is used to provide gain such that there is minimal signal loss at the desired frequency. However, the oscillator circuit is not allowed to oscillate since oscillations would distort the received input signal.

Figure 7:
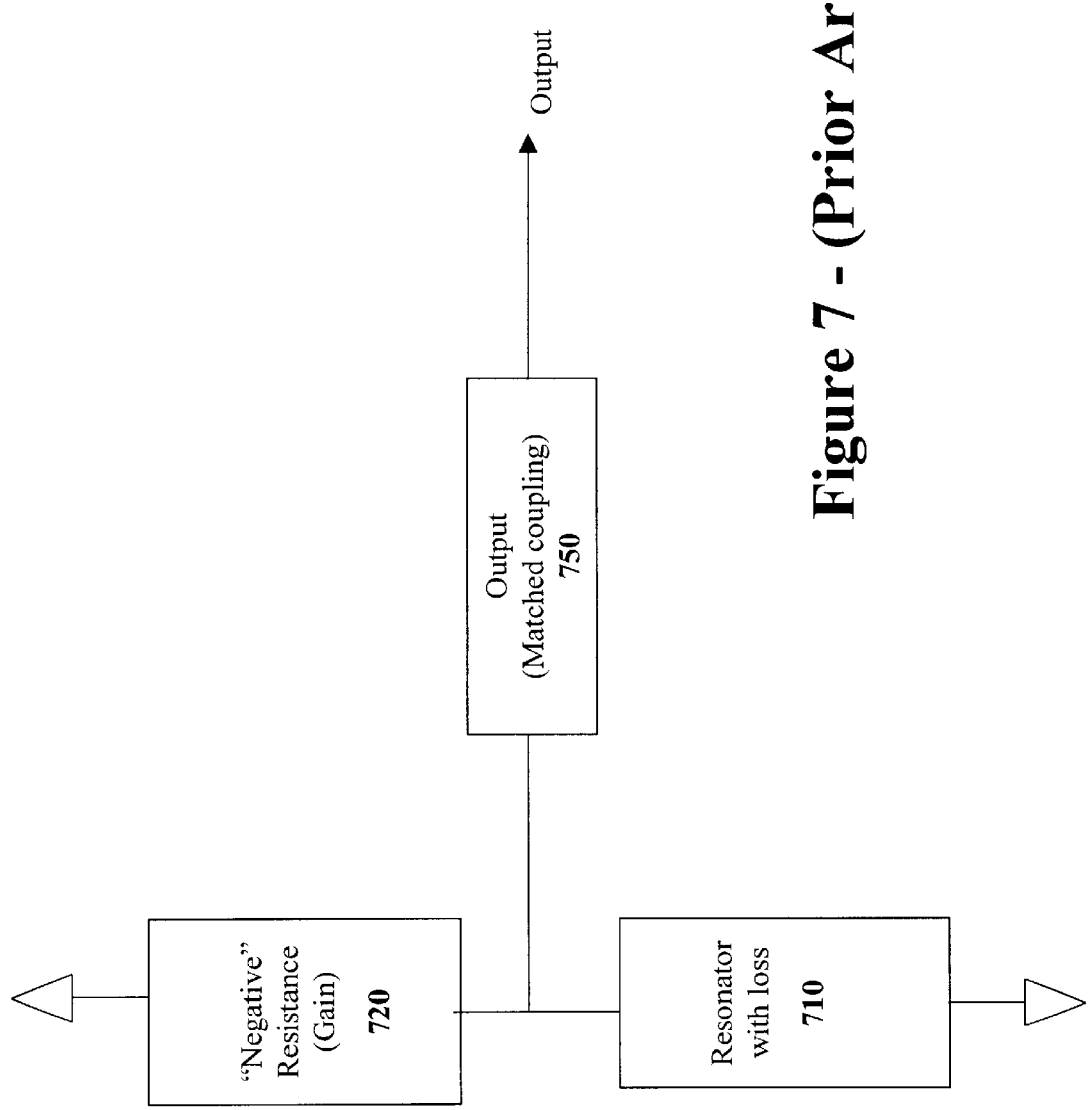
FIG. 7 illustrates a simple block diagram of an oscillator circuit.

FIG. 7 illustrates a block diagram of a standard negative resistance oscillator. Referring to the diagram of FIG. 7, a resonator 710 that experiences some loss is coupled to a "negative" resistance unit 720 that provides gain. The resonator 710 provides an oscillating signal. The negative resistance unit 720 amplifies the oscillating signal by a set gain. The resultant oscillating signal is passed to an output with a matched coupling.

Figure 8:
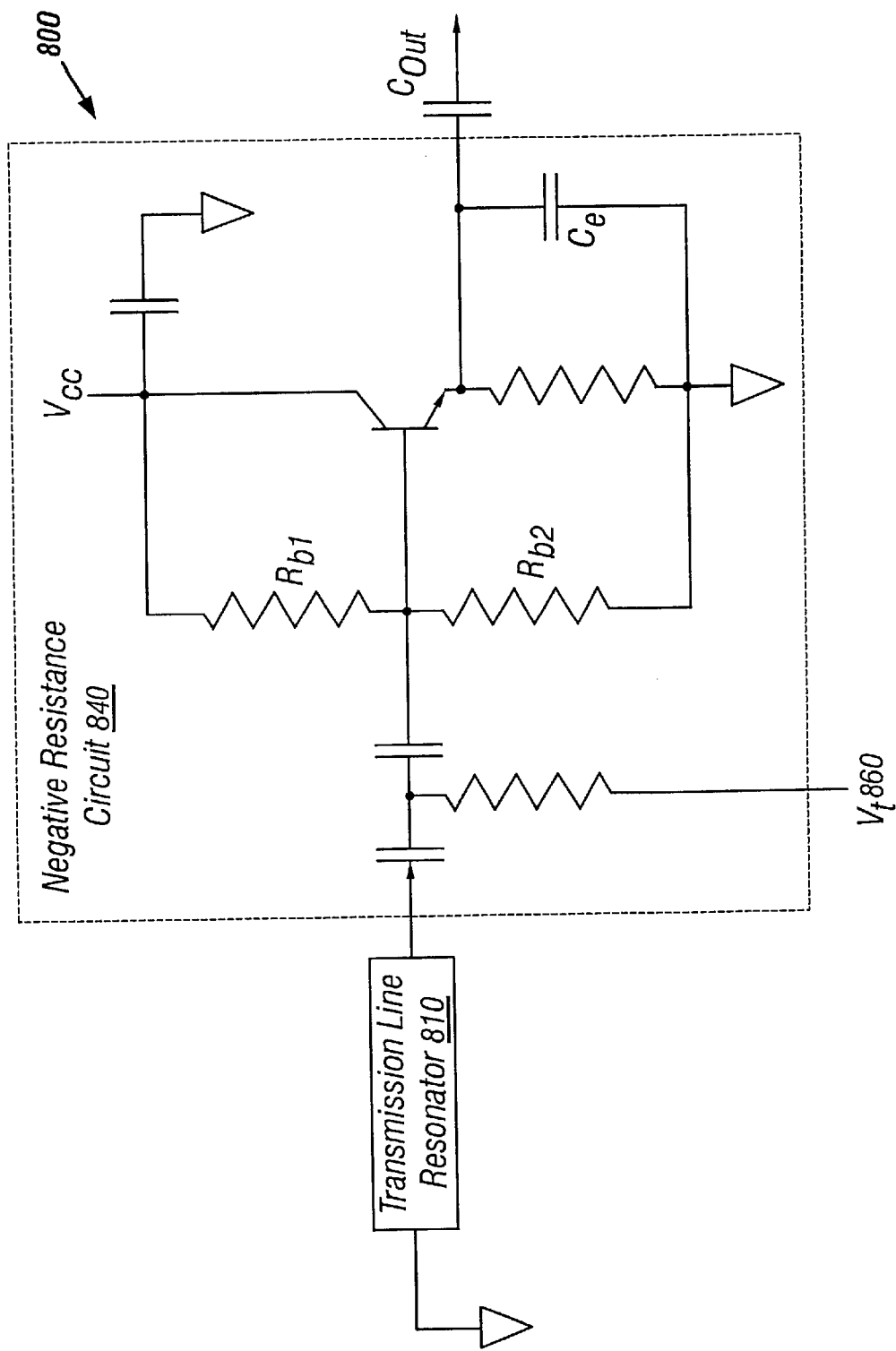
FIG. 8 illustrates one embodiment of an Ultra-high Frequency (UHF) voltage controlled oscillator circuit.

FIG. 8 illustrates a typical circuit embodiment of the negative resistance oscillator of FIG. 7. The oscillator circuit of FIG. 8 is a typical Ultra-High Frequency (UHF) voltage controlled oscillator (VCO) circuit 800. Referring to FIG. 8, a transmission line resonator 810 is coupled to a negative resistance circuit 840 that provides gain. The output signal from the oscillator circuit 800 is from an output capacitor $C_{out}$. Note that the oscillator circuit 800 of FIG. 8 includes a tuning voltage $V_t$ that is used to select the oscillation frequency of the voltage-controlled oscillator (VCO) circuit 800.

Figure 9:
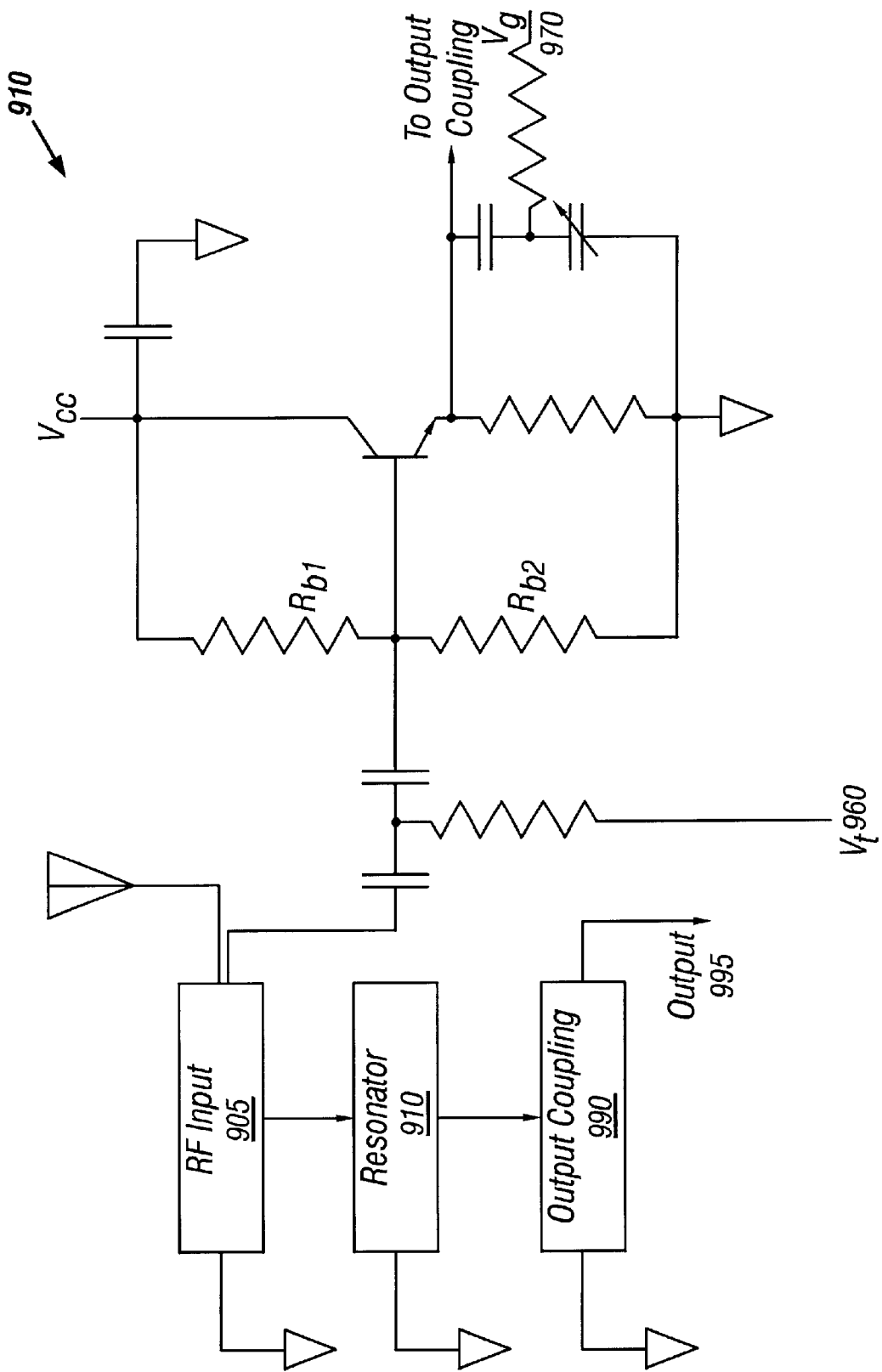
FIG. 9 illustrates one embodiment of an active filter circuit that uses a voltage controlled oscillator circuit.

The variable active filter design of the present invention uses an oscillator circuit such as the oscillator circuit 800 in FIG. 8 to provide gain to the variable active filter circuit. FIG. 9 illustrates one possible embodiment of an active filter circuit constructed according to the teachings of the present invention.

In the active filter circuit of FIG. 9, a radio frequency input signal 905 is coupled to the resonator 910 of the oscillator type circuit. In one embodiment, the radio frequency input signal 905 and the resonator 910 are coupled using coupled microstrips or stripline transmission lines. The oscillator type circuit is controlled with a tuning voltage $V_t$ 960 that selects a desired filter frequency and an oscillator gain control $V_g$ 970 that selects a gain value. The output of the active filter circuit is obtained by coupling an output coupling 990 to the resonator 910 of the oscillator type circuit. The output signal 995 is a signal filtered at the desired tuning frequency as selected by the tuning voltage $V_t$ 960.

As set forth in the beginning of this section, the oscillator type circuit in the active filter should not be allowed to oscillate. To enforce this requirement, the present invention is calibrated to set the oscillator gain control $V_g$ 970 to a value just below where the oscillator would oscillate. Referring back to FIG. 6, a calibration is initiated by activating the calibration control signal 660. The activated calibration control signal 660 will cause multiplexor 680 to deliver the reference oscillator signal 670 through the active filter circuit 620. An oscillation detection circuit may be used to detect the gain control 650 setting where the active filter circuit 620 begins to oscillate. Then the oscillation detection circuit will reduce the gain control 650 setting to a voltage value just below the oscillation point.

When designing tunable active filters using negative resistance elements (such as the negative resistance element 720 of FIG. 7) with a large tuning range (i.e. e.g. 2:1), it can be challenging to avoid spurious oscillations due to resonance's caused by biasing elements. This design problem has already been solved in the case of broadly tunable voltage controlled oscillators (VCOs) for a variety of gain topologies. It is a much simpler problem to redesign VCOs to have barely insufficient gain to oscillate than to design tunable negative resistance elements without spurious gain. Since the active filter of the present invention relies VCOs instead of negative resistance elements, the present invention yields designs with unprecedented tunability. Specifically, the active filter design of the present invention has been used to create an active filter with a 2:1 frequency range.

An Alternate Receiver With Tunable Bandpass Filter Design

In the receiver system embodiment of FIG. 5 that includes an active bandpass filter 520, the receiver system may be periodically taken off-line to calibrate the variable bandpass filter 520. In an alternate embodiment disclosed in FIG. 10, the receiver circuit uses two active filter circuits such that one active filter circuit may be used to continually calibrate a gain signal for the other variable bandpass filter.

Figure 10:
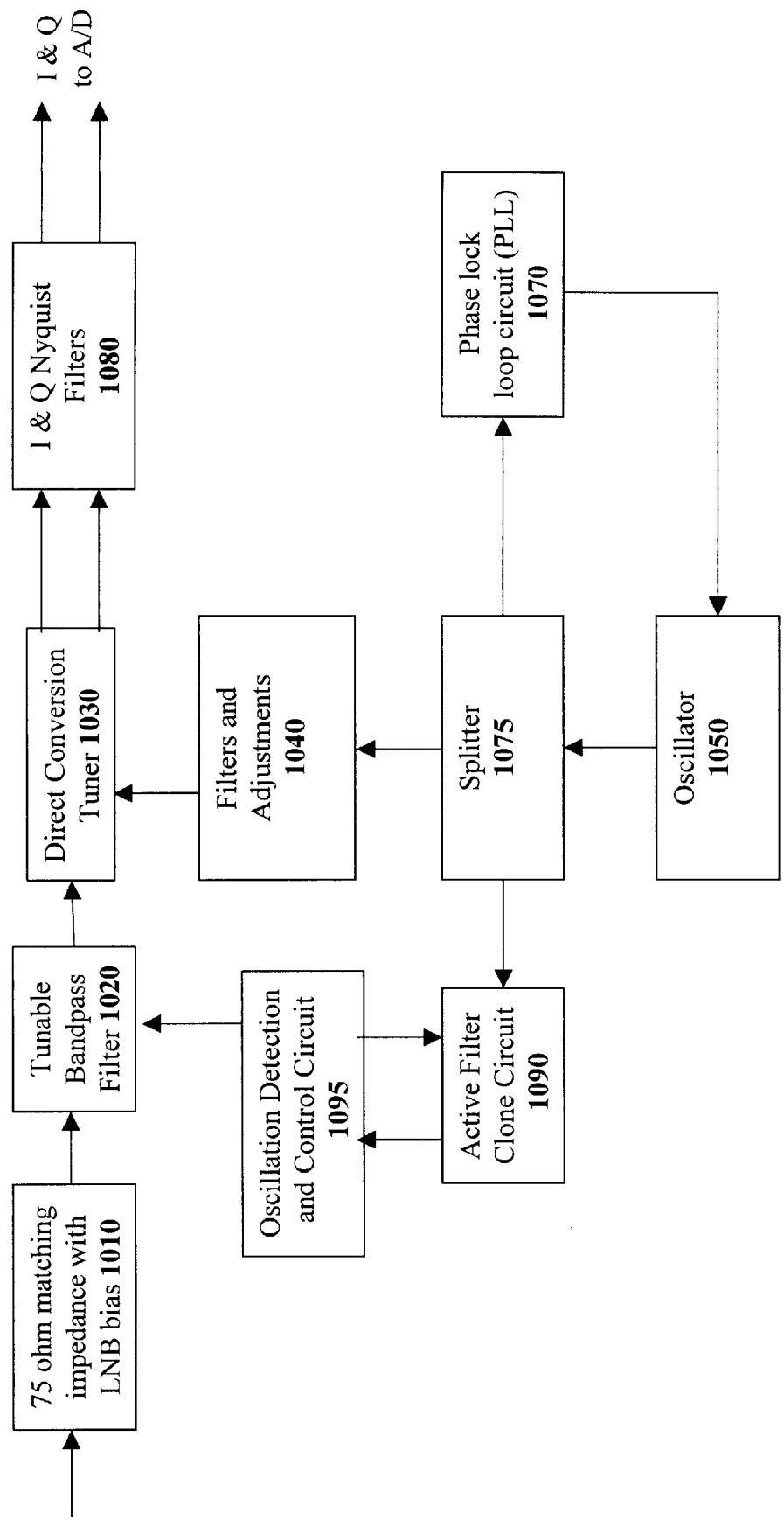
FIG. 10 illustrates a block diagram of a receiver with two voltage controlled oscillator based active filter circuits such that one active filter is used to calibrate the gain signal to be applied to the other active filter circuit.
Figure 11:
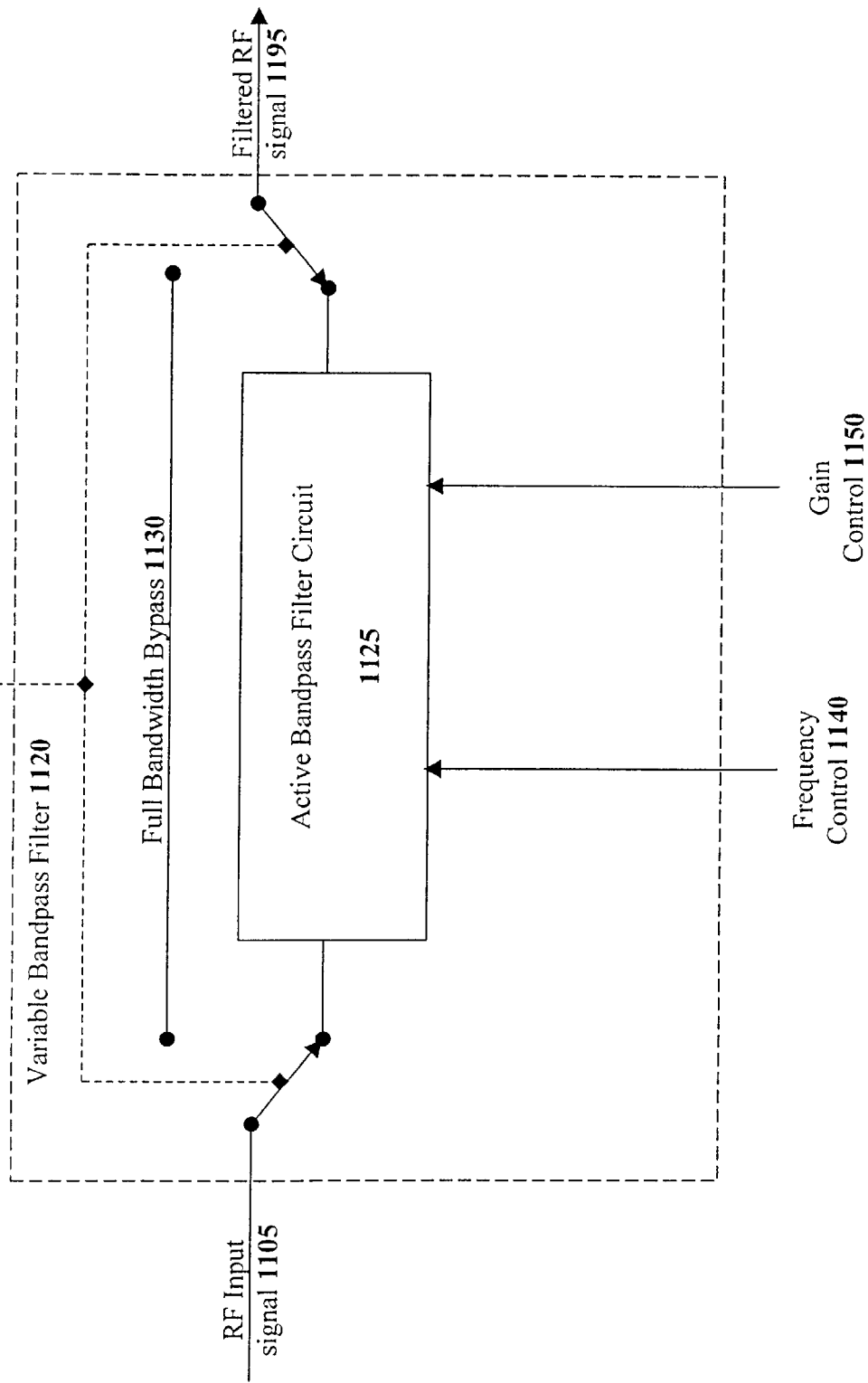
FIG. 11 illustrates an embodiment of a tunable bandpass filter circuit that may or may not filter an RF signal.

In the embodiment of FIG. 10, a first active filter circuit is used within a tunable bandpass filter 1020 to filter the signals received by the tuner 1030. FIG. 11 illustrates an embodiment of the tunable bandpass filter circuit 1020. The active bandpass filter circuit 1125 in the tunable bandpass filter circuit 1020 can be constructed according to the teachings in FIG. 9.

Referring back to FIG. 10, a second active filter circuit, active filter clone circuit 1090, is coupled to receive a reference signal from oscillator 1050. The active filter clone circuit 1090 is built identical to the first active filter circuit in tunable bandpass filter 1020.

An oscillation detection and control circuit 1095 monitors the output of the active filter clone circuit 1090. The oscillation detection and control circuit 1095 analyzes the output of the active filter clone circuit 1090 and generates a gain input into active filter clone circuit 1090 that causes the oscillator in the active filter clone circuit 1090 to begin oscillating. The oscillation detection and control circuit 1095 uses a gain input slightly The foregoing has described an active filter circuit for filtering signals across a wide frequency range is disclosed. It is contemplated that changes and modifications may be made by one of ordinary skill in the art, to the materials and arrangements of elements of the present invention without departing from the scope of the invention.

I claim:

1. A variable bandpass filter system, comprising:
   a first switch to receive an RF input signal and an oscillating calibration signal, said first switch operating to pass said RF input signal or said oscillating calibration signal based a control signal; and
   a first active filter circuit having a first oscillator, said first active filter circuit to receive output of said first switch, and frequency and gain control signals, said frequency control signal selecting an operating frequency of the first oscillator, such that said operating frequency determines a range of frequencies to pass within said RF input signal, and said gain control signal selecting gain of the first oscillator,
   where said first oscillator includes a negative resistance circuit, including:
   a transistor having base, collector, and emitter terminals, the collector terminal connected to a first voltage source, and the emitter terminal connected to a second voltage source through a first resistor,
   a second resistor coupled between the first voltage source and the base terminal of the transistor,
   a third resistor coupled between the base terminal of the transistor and the second voltage source, and
   a pair of series capacitors connected in parallel to said first resistor,
   where said first switch enables said first oscillator to be calibrated by passing the oscillating calibration signal.

2. The system of claim 1, wherein said first switch is a multiplexer.

3. The system of claim 1, wherein said frequency control signal is input to the gate terminal of the transistor, and said gain control signal is input between said pair of series capacitors.

4. The system of claim 1, further comprising:
   a plurality of microstrips coupled to said first switch and said first active filter circuit.

5. The system of claim 1, further comprising:
   a plurality of stripline transmission lines coupled to said first switch and said first active filter circuit.

6. The system of claim 1, further comprising:
   a second active filter circuit having a second oscillator, where said second active filter circuit calibrates said gain control signal while the first active filter circuit is operating to filter the RF input signal.

7. The system of claim 1, further comprising:
   a second switch coupled to said first switch and said first active filter circuit, said second switch selecting a filter mode, such that, in a first mode, the RF input signal is filtered by said first active filter circuit, and in a second mode, said first active filter circuit is bypassed to output full bandwidth of the RF input signal.

8. A method for filtering an input signal, comprising:
   providing an oscillator including:
   a transistor having base, collector, and emitter terminals, the collector terminal connected to a first voltage source, and the emitter terminal connected to a second voltage source through a first resistor,
   a second resistor coupled between the first voltage source and the base terminal of the transistor,
   a third resistor coupled between the base terminal of the transistor and the second voltage source, and
   a pair of series capacitors connected in parallel to said first resistor;
   calibrating said oscillator including sending an oscillating signal to the oscillator, selecting an operating frequency of the oscillator, and adjusting gain of the oscillator to where the oscillator acts as a filter;
   receiving the input signal; and
   filtering the input signal through the calibrated oscillator.

9. The method of claim 8, wherein said adjusting gain of the oscillator to a level where the oscillator acts as a filter includes adjusting the gain of the oscillator to a first level where the oscillating signal starts to oscillate, and lowering the gain to a second level just below the first level.

10. The method of claim 8, wherein said filtering the input signal includes selecting and passing a range of frequencies within the input signal while rejecting frequencies outside of said range.

11. The method of claim 8, further comprising:
    enabling selection of full bandwidth bypassing of said input signal.

* * * * *